United States Patent
Yang

(10) Patent No.: US 11,541,493 B2
(45) Date of Patent: Jan. 3, 2023

(54) MULTI-AXIS MECHANISM DEVICE

(71) Applicant: Adnanotek Corp., New Taipei (TW)

(72) Inventor: Kai Yang, New Taipei (TW)

(73) Assignee: ADNANOTEK CORP., New Taipei (TW)

(*) Notice: Subject to any disclaimer, the term of this patent is extended or adjusted under 35 U.S.C. 154(b) by 861 days.

(21) Appl. No.: 16/445,693

(22) Filed: Jun. 19, 2019

(65) Prior Publication Data

US 2020/0398390 A1    Dec. 24, 2020

(51) Int. Cl.
| | | |
|---|---|---|
| B05B 15/58 | (2018.01) | |
| B23Q 1/48 | (2006.01) | |
| B05B 15/68 | (2018.01) | |
| B05B 9/00 | (2006.01) | |
| B05B 1/24 | (2006.01) | |

(52) U.S. Cl.
CPC ............ B23Q 1/4828 (2013.01); B05B 15/68 (2018.02); *B05B 1/24* (2013.01); *B05B 9/002* (2013.01)

(58) Field of Classification Search
None
See application file for complete search history.

(56) References Cited

U.S. PATENT DOCUMENTS

| | | | | |
|---|---|---|---|---|
| 5,439,522 A * | 8/1995 | Zejda | ............. | C23C 14/566 414/217 |
| 6,740,161 B2 * | 5/2004 | Heide | ............. | B65B 51/023 118/500 |
| 7,256,132 B2 * | 8/2007 | Lerner | ............. | H01L 21/68 118/500 |
| 8,464,964 B2 * | 6/2013 | Wiseman | ............. | B05B 17/08 239/18 |
| 8,616,150 B2 * | 12/2013 | Savoie | ............. | B24B 13/005 118/712 |
| 2003/0005884 A1 * | 1/2003 | Makimura | ............. | B61B 10/04 118/500 |
| 2007/0089767 A1 * | 4/2007 | Yamamoto | ............. | B08B 3/02 134/137 |
| 2008/0276864 A1 * | 11/2008 | Koelmel | ............. | H01L 21/67115 118/500 |
| 2010/0251963 A1 * | 10/2010 | Herre | ............. | B05B 16/60 118/500 |
| 2011/0094442 A1 * | 4/2011 | Sekimoto | ............. | H01L 21/67051 414/800 |
| 2021/0398842 A1 * | 12/2021 | Park | ............. | H01L 21/68792 |

* cited by examiner

*Primary Examiner* — Jethro M. Pence
(74) *Attorney, Agent, or Firm* — Li & Cai Intellectual Property (USA) Office

(57) ABSTRACT

A multi-axis mechanism device includes: a base module, a first moving module, a second moving module, a third moving module, a reaction module, a tilting module and a rotating module. The first moving module performs a first axial movement relative to the movable bearing platform to drive the reaction module to be displaced relative to the movable bearing platform. The second moving module performs a second axial movement relative to the first moving module to drive the reaction module to be displaced relative to the first moving module. The third moving module drives the movable bearing platform to perform a third axial movement relative to the module body to drive the reaction module to be displaced relative to the module body. The reaction module is driven by the tilting module to perform titling action and by the rotating module to perform rotating operation relative to the central axis.

10 Claims, 7 Drawing Sheets

MULTI-AXIS MECHANISM DEVICE

BACKGROUND

1. Technical Field

The present invention relates to a multi-axis mechanism device, in particular to a multi-axis mechanism device with multi-axial movement and tilting function.

2. Description of Related Art

The vacuum coating method is a coating technology commonly used in products of the photovoltaic industry and the semiconductor industry such as touch panels, solar cells and etc. The vacuum coating method is known to include physical vapor deposition (PVD) and chemical vapor deposition (CVD). Taking a thin film solar cell process as an example, it is necessary to apply a vacuum plating method to a substrate such as a transparent conductive film electrode, a photoelectric conversion layer, or the like, or, for example, in the production of a copper indium gallium thin film solar cell, it is necessary to perform a selenization treatment after plating a copper thin film or an indium thin film on the substrate.

At present, when the existing vacuum coating equipment performs the coating process on the object, or when the object is to be inspected and viewed after the coating process, if the object is to be tilted, the object is tilted by setting a vacuum motor to obtain the effect of titling. However, the vacuum motor is prone to problems such as overheating and unsatisfactory operation, which may cause trouble in the detection program or the coating process.

SUMMARY

The technical problem to be solved by the present invention is to provide a multi-axis mechanism device for the deficiencies of the prior art to solve the lack of the prior art.

In order to solve the above technical problem, one technical solution adopted by the present invention is to provide a multi-axis mechanism device, including: a base module, a first moving module, a second moving module, a third moving module, and a reaction module, a tilting module and a rotating module. The base module includes a module body and a movable bearing platform that is movably coupled to the module body. The first moving module is movably disposed on the movable bearing platform. The second moving module is movably disposed on the first moving module. The third moving module is located in the module body and is movably connected to the movable bearing platform. The reaction module is disposed on the base module, the first moving module, and the second moving module in a penetrating way, and has a central axis. The tilting module is disposed on the reaction module in a penetrating way and movably coupled to the reaction module. The rotating module is disposed on the reaction module in a penetrating way and movably coupled to the reaction module. The first moving module performs a first axial movement relative to the movable bearing platform to drive the reaction module to be displaced relative to the movable bearing platform. The second moving module performs a second axial movement relative to the first moving module to drive the reaction module to be displaced relative to the first moving module. The third moving module drives the movable bearing platform to perform a third axial movement relative to the module body to drive the reaction module to be displaced relative to the module body. The reaction module is driven by the rotating module to perform a titling action. The reaction module is driven by the rotating module to perform a rotating operation relative to the central axis.

Preferably, the first moving module includes: a first moving unit and a first driving unit movably disposed on the movable bearing platform, wherein the first driving unit is movably disposed on the first moving unit in a penetrating way and disposed on the movable bearing platform; wherein, when the first driving unit rotates, the first moving unit is driven by the first driving unit to perform the first axial movement relative to the movable bearing platform.

Preferably, the second moving module includes: a second moving unit and a second driving unit movably disposed on the first moving module, wherein the second driving unit is movably disposed on the second moving unit in a penetrating way and disposed on the first moving module; wherein, when the second driving unit rotates, the second moving unit is driven by the second driving unit to perform the second axial movement relative to the first driving unit.

Preferably, the third moving module includes: a third moving unit and a third driving unit movably connected to the movable bearing platform and the module body, wherein the third driving unit is movably connected to the first moving unit and disposed on the module body; wherein, when the third driving unit rotates, the third moving unit is driven by the third driving unit to perform the third axial movement relative to the module body.

Preferably, the reaction module includes: a housing unit, a support unit, a swing unit and an activity unit. The housing unit is disposed on the base module, the first moving module, and the second moving module in a penetrating way. The support unit is located in the housing unit. The swing unit is coupled to the housing unit, and the swing unit has an accommodation space. The activity unit is movably connected to the support unit and located in the accommodation space, and the activity unit contacts the swing unit.

Preferably, the tilting module includes: a fourth driving unit and a guiding unit connected to the fourth driving unit, wherein the guiding unit is disposed on the housing unit in a penetrating way and movably connected to the swing unit; wherein, the fourth driving unit drives the guiding unit to perform the third axial movement to drive the swing unit to perform the tilting action, and the swing unit drives the activity unit to perform the tilting action.

Preferably, the swing unit includes: a first component, a movable member and a second component. The first component is coupled to the housing unit. The movable member is coupled to the first member. The second component is coupled to the movable member and the second component has a joint portion. The guiding unit has a guiding portion, and the guiding portion is movably connected to the joint portion. The guiding unit performs the third axial movement and drives the joint portion through the guiding portion to drive the second member to perform the titling action, thereby causing one portion of the movable member to be in a compressed state and the other portion of the movable member to be in an extended state.

Preferably, the reaction module further includes: a heating unit connected to the activity unit and located between the activity unit and the second member.

Preferably, the rotating module includes: a fifth driving unit and a linkage unit movably coupled to the fifth driving unit, wherein the linkage unit is disposed on the reaction module in a penetrating way and movably coupled to a connection portion of the reaction module; wherein the fifth driving unit drives the linkage unit to rotate and the linkage unit drives the connection portion to operate, thereby making the reaction module to perform a rotation action relative to the central axis.

Preferably, the base module further includes: a limiting unit disposed on the movable bearing platform in a penetrating way and disposed on the module body.

The present invention has the beneficial effects that the multi-axis mechanism device provided by the present invention utilizes the technical solution of 'the multi-axis mechanism device comprises: a base module, a first moving module, a second moving module, a third moving module, and a reaction a module, a tilting module, and a rotating module", "a base module, the base module includes a module body and a movable bearing platform movably coupled to the module body", "the first moving module is movably disposed on the movable bearing platform", "the second moving module is movably disposed on the first moving module", "the third moving module is located in the module body, and is movably connected to the movable bearing platform", "the reaction module is disposed on the base module, the first moving module, and the second moving module in a penetrating way", and has a central axis", "the tilting module is disposed in the reaction module and movably connected to the reaction module", "the rotating module is disposed on the reaction module in a penetrating way and movably coupled to the reaction module" and "the first moving module performs a first axial movement relative to the movable bearing platform to drive the reaction module to be displaced relative to the movable bearing platform, the second moving module performs a second axial movement relative to the first moving module to drive the reaction module to be displaced relative to the first moving module, the third moving module drives the movable bearing platform to perform a third axial movement relative to the module body to drive the reaction module to be displaced relative to the module body, the reaction module is driven by the tilting module to perform a titling action, and the reaction module is driven by the rotating module to perform a rotating operation relative to the central axis" to achieve the technical effects of multi-axial movement and tilting action.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

DESCRIPTION OF THE EXEMPLARY EMBODIMENTS

The following is a specific embodiment to illustrate the implementation of the "multi-axis mechanism device" disclosed in the present invention, and those skilled in the art can understand the advantages and effects of the present invention from the contents disclosed in the specification. The present invention may be implemented or applied in various other specific embodiments, and various modifications and changes may be made without departing from the spirit and scope of the invention. In addition, the drawings of the present invention are merely illustrative and are not intended to be delineated in actual dimensions. The following embodiments will further explain the related technical content of the present invention, but the disclosure is not intended to limit the scope of the present invention.

It should be understood that, although the terms "first", "second", "third", and the like may be used herein to describe various elements, these elements are not limited by these terms. These terms are primarily used to distinguish one element from another. In addition, the term "or" as used herein may include a combination of any one or more of the associated listed items, depending on the actual situation.

First Embodiment

Figure 1:
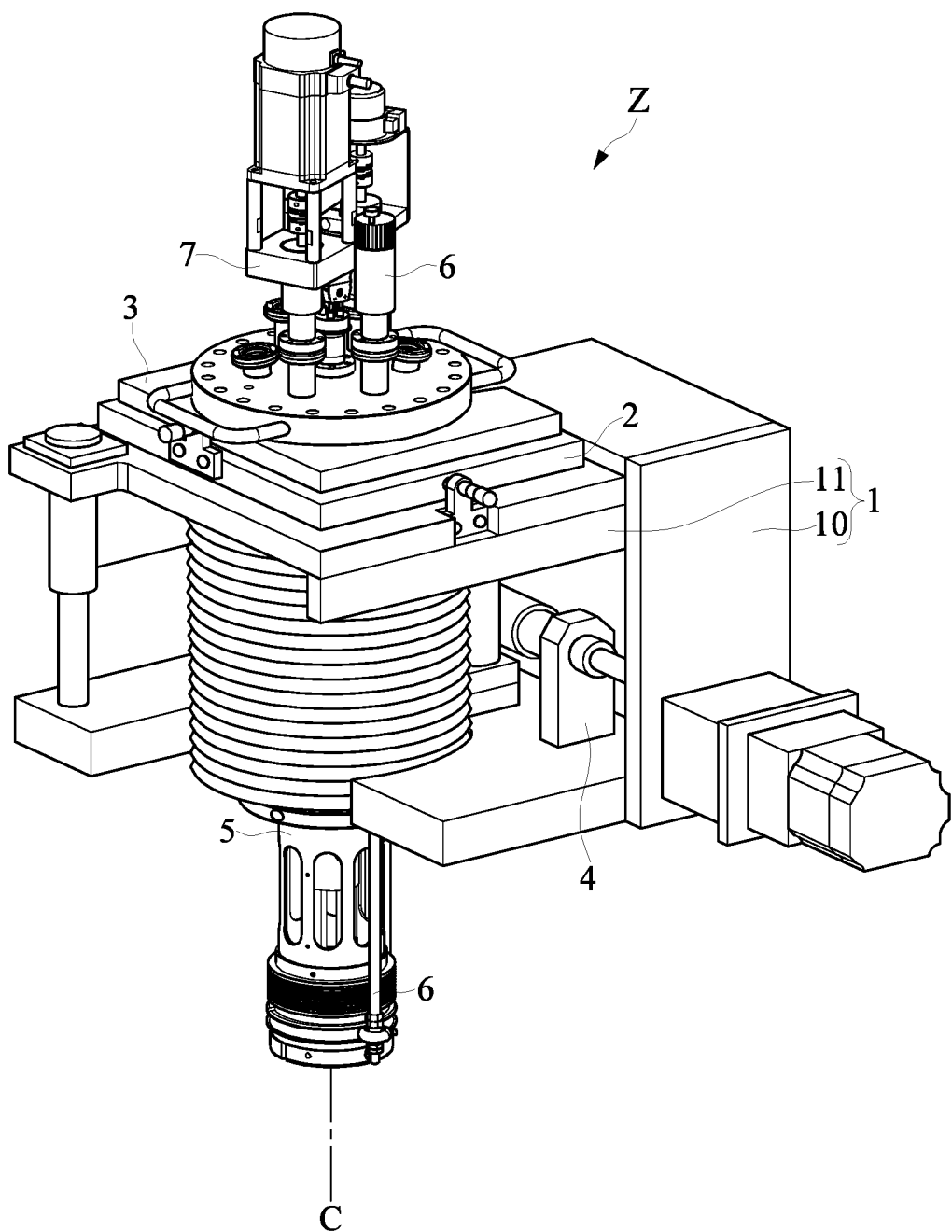
FIG. 1 is a perspective view of the multi-axis mechanism device according to the first embodiment of the present invention.

Reference is made to FIG. 1, which is a perspective view of the multi-axis mechanism device according to the first embodiment of the present invention. As shown in the figure, the first embodiment of the present invention provides a multi-axis mechanism device Z, including: a base module 1, a first moving module 2, a second moving module 3, a third moving module 4, a reaction module 5, a tilting module 6 and a rotating module 7. The base module 1 includes a module body 10 and a movable bearing platform 11 that is movably coupled to the module body 10. The first moving module 2 is movably disposed on the movable bearing platform 11. The second moving module 3 can be movably disposed on the first moving module 2. The third moving module 4 is located in the module body 10 and movably connected to the movable bearing platform 11. The reaction module 5 is disposed on the base module 1, the first moving module 2, and the second moving module 3 in a penetrating way. The reaction module 5 has a central axis C. The reaction module 5 can be a detecting device or a coating device, and the present invention is not limited thereto. The tilting module 6 is disposed on the reaction module 5 in a penetrating way and movably connected to the reaction module 5. The rotating module 7 is disposed on the reaction module 5 in a penetrating way and movably connected to the reaction module 5. The first moving module 2 performs a first axial movement relative to the movable bearing platform 11 to drive the reaction module 5 to be displaced relative to the movable bearing platform 11. The second moving module 3 performs a second axial movement relative to the first moving module 2 to drive the reaction module 5 to be displaced relative to the first moving module 2. The third moving module 4 drives the movable bearing platform 11 to perform a third axial movement relative to the module body 10 to drive the reaction module 5 to be displaced relative to the module body 10. The reaction module 5 is tilted by the driving of the tilting module 6. The reaction module 5 is rotated relative to the central axis 100 by the driving of the rotating module 7.

Specifically, the multi-axis mechanism device Z provided by the present invention includes a base module 1, a first moving module 2, a second moving module 3, a third moving module 4, and a reaction module 5. The base module 1 includes a module body 10 and a movable bearing platform 11. The module body 10 can be a hollow structure for providing a third moving module 4, the movable bearing platform 11 can be movably connected to the module body 10, and the reaction module 5 can be disposed on the module body 10 and the movable bearing platform 11 in a penetrating way. Further, the first moving module 2 and the second moving module 3 are disposed on the movable bearing platform 11. In this embodiment, the first moving module 2 is movably disposed on the movable bearing platform 11, and the second moving module 3 is movably disposed on the first moving module 2, but the present invention not limited thereto. The positions of the first moving module 2 and the second moving module 3 may also be opposite to each other. The third moving module 4 is movably connected to the movable bearing platform 11. The reaction module 5 is disposed on the first moving module 2 and the second moving module 3 in a penetrating way.

Therefore, the multi-axis mechanism device Z of the present invention can be moved to the first axial movement by the first moving module 2 to drive the reaction module 5 to also move to the first axial movement. When the multi-axis mechanism device Z can move in the second axial movement by the second moving module 3, the second moving module 3 will move the reaction module 5 to the second axial movement. Moreover, when the multi-axis mechanism device Z can move the movable bearing platform 11 to the third axial movement by the third moving module 4, the movable bearing platform 11 will move the reaction module 5 to the third axial movement. Here, the first axial movement, the second axial movement and the third axial movement are perpendicular to each other.

Figure 6:
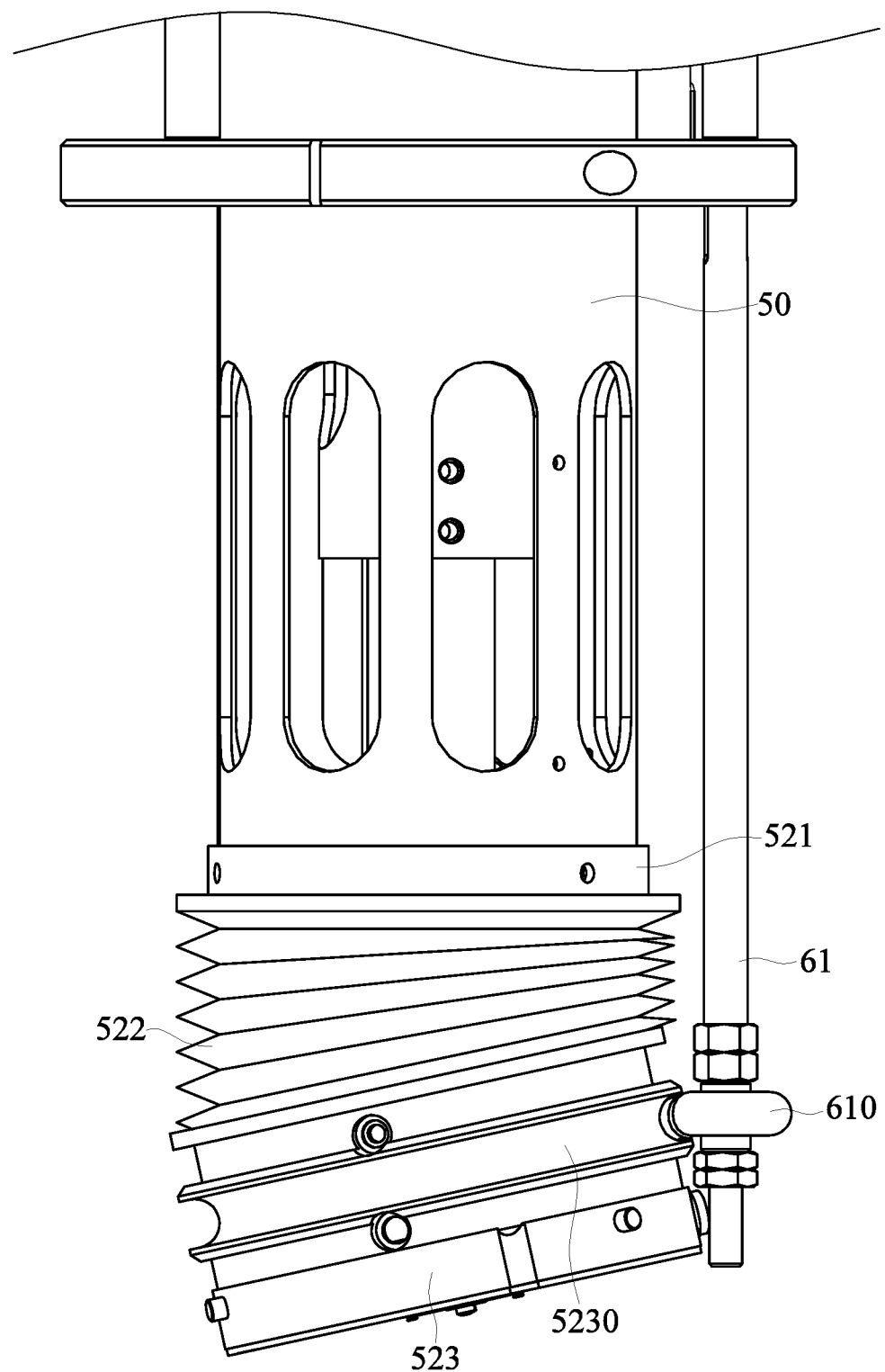
FIG. 6 is a schematic view showing the operation of the reaction module of the multi-axis mechanism device according to the third embodiment of the present invention.

Further, the multi-axis mechanism device Z of the present invention further includes a tilting module 6 and a rotating module 7. The tilting module 6 and the rotating module 7 are disposed on the reaction module 5 in a penetrating way and movably connected to the reaction module 5. Therefore, the multi-axis mechanism device Z of the present invention can drive the reaction module 5 through the tilting module 6 to perform a titling action (as shown in FIG. 6). Moreover, the multi-axis mechanism device Z can also drive the reaction module by the rotating module 7 to rotate relative to the central axis 100 (i.e., similar to the rotation action).

Therefore, the multi-axis mechanism device Z provided by the present invention can provide the multi-axial movement mode and the tilting effect to the reaction module 5 through the above technical solution, thereby facilitating the operation of detection procedures or other procedures on objects (such as semiconductor devices, but not limited thereto).

However, the above-mentioned examples are only one of the possible embodiments and are not intended to limit the present invention.

Second Embodiment

Figure 2:
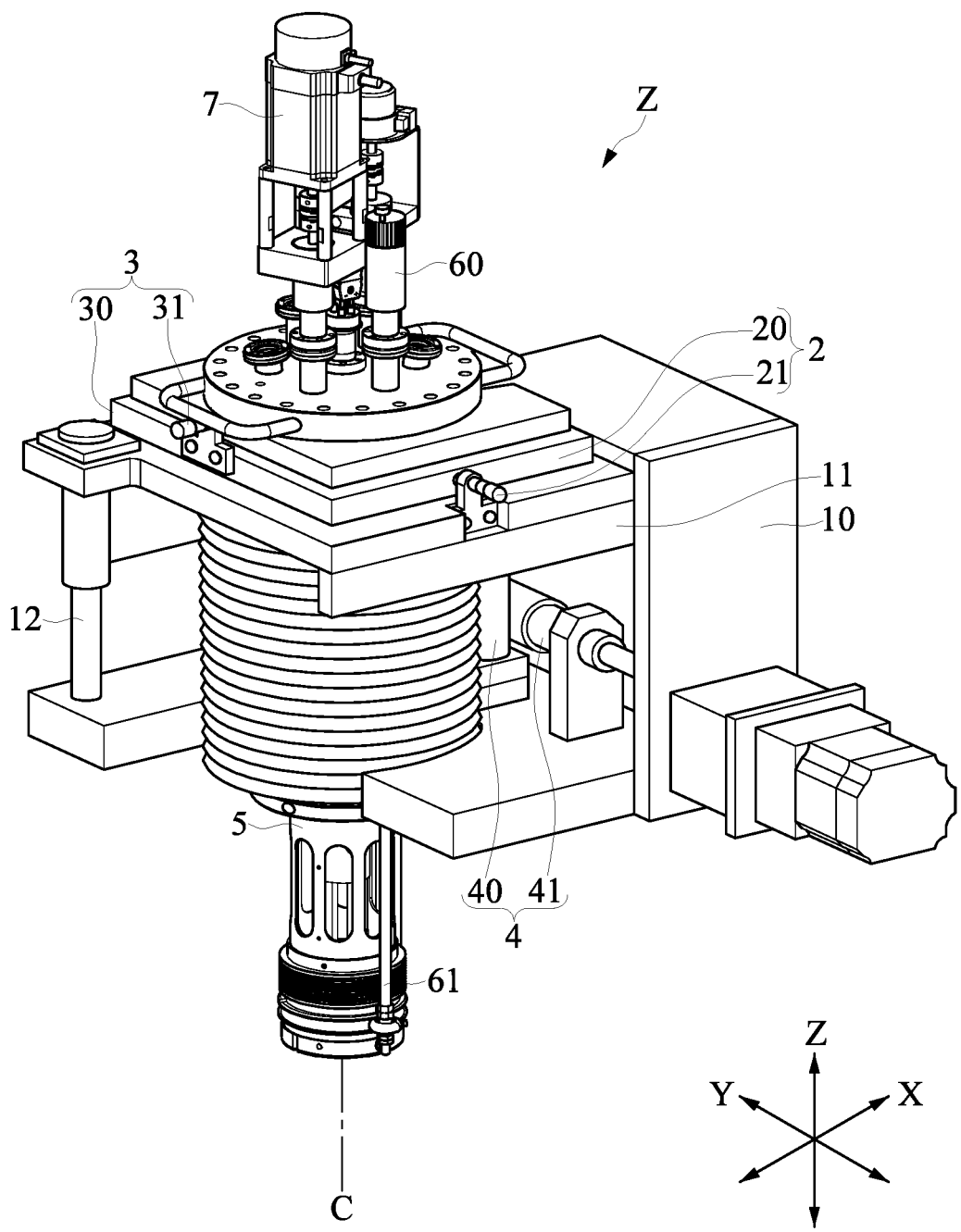
FIG. 2 is a perspective view of the multi-axis mechanism device according to the second embodiment of the present invention.
Figure 3:
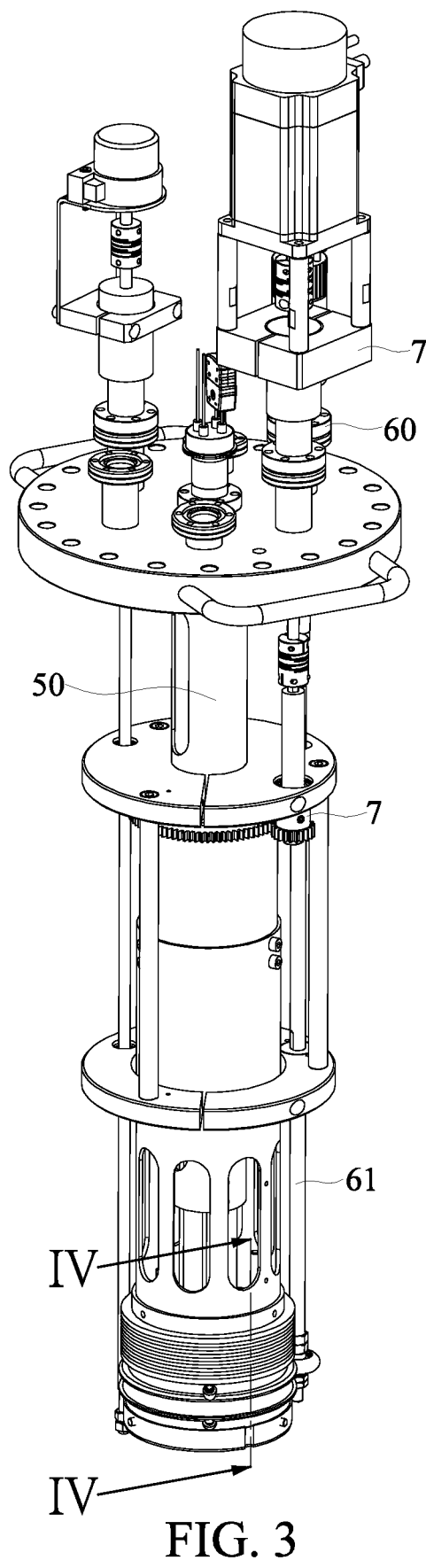
FIG. 3 is a partial perspective view of the multi-axis mechanism device according to the third embodiment of the present invention.
Figure 4:
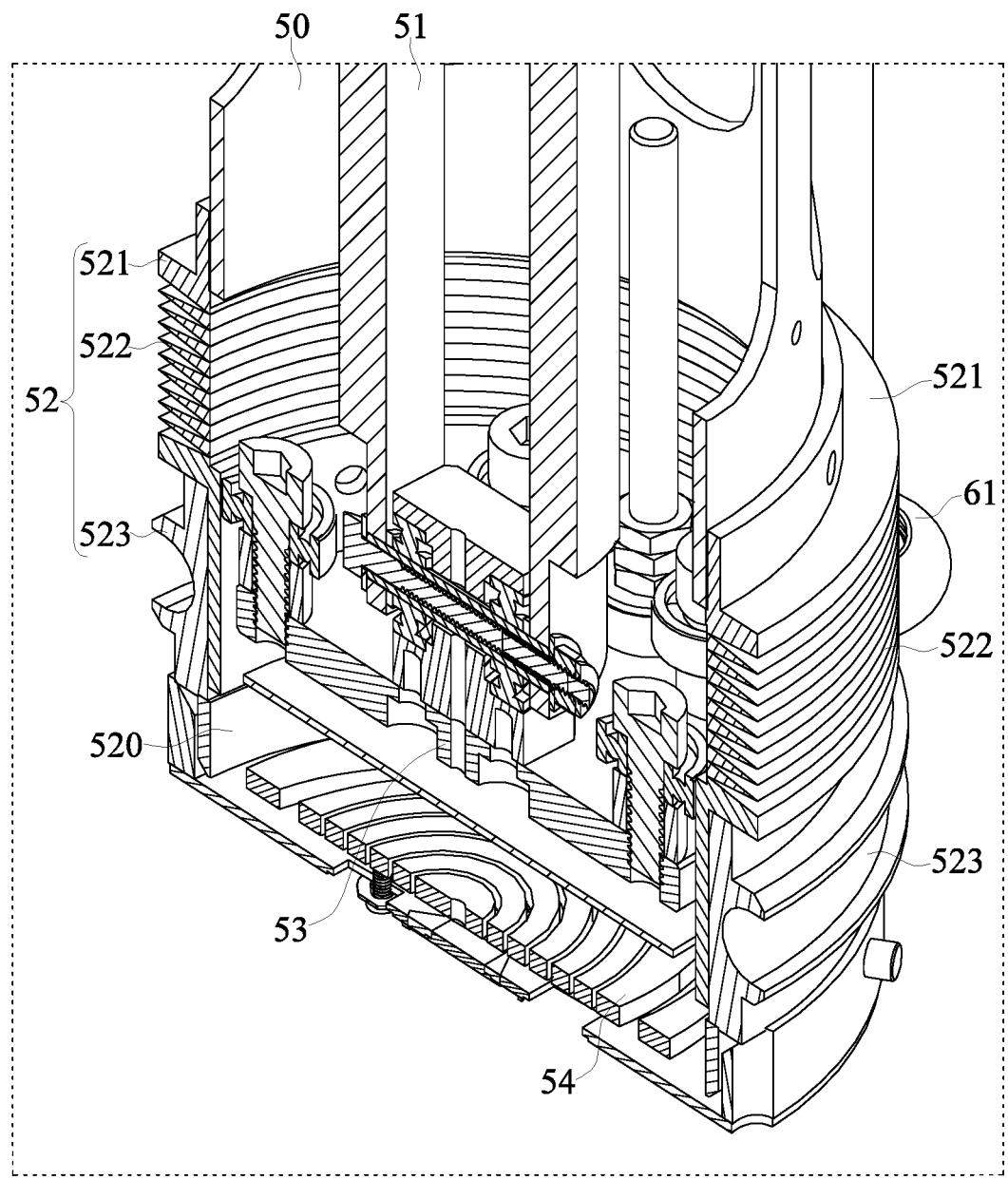
FIG. 4 is a schematic cross-sectional view showing a portion IV of FIG. 3.
Figure 5:
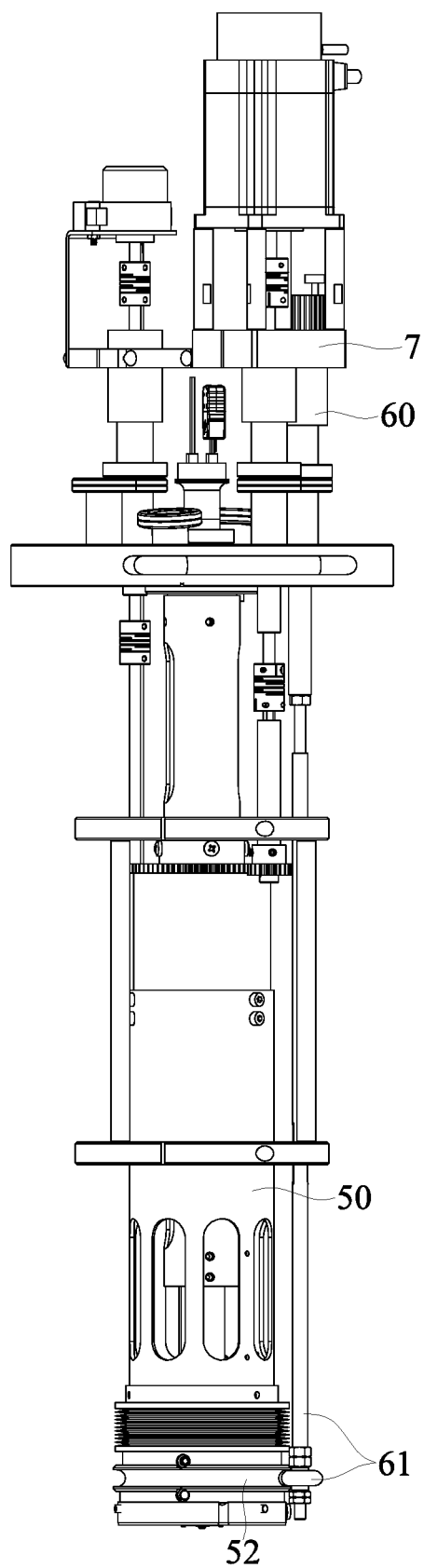
FIG. 5 is a partial front elevational view of the multi-axis mechanism device of the third embodiment of the present invention.

Reference is made to FIG. 2, which is a perspective view of the multi-axis mechanism device according to the second embodiment of the present invention, and FIG. 1. As shown in the figures, the same components of the multi-axis mechanism device of the present embodiment are similar to those of the multi-axis mechanism device of the first embodiment, and will not be described again. It is worth noting that, in this embodiment, the first moving module 2 may include a first moving unit 20 and a first driving unit 21 movably disposed on the movable bearing platform 11, wherein the first driving unit 21 is movably disposed on the first moving unit 20 in a penetrating way and disposed on the movable bearing platform 11. When the first driving unit 21 rotates, the first moving unit 20 is driven by the first driving unit 21 to perform a first axial movement relative to the movable bearing platform 11.

For example, the first moving module 2 provided by the present invention includes a first moving unit 20 and a first driving unit 21. The first moving unit 20 can be a moving platform, and can be movably jointed or engaged with the movable bearing platform 11. The first driving unit 21 can be a driving handle, and the first driving unit 21 can be fixed to the movable bearing platform 11 and movably connected to the first moving unit 20. Therefore, the user can drive the first moving unit 20 to perform the first axial movement (such as the X axis, but not limited thereto) on the movable bearing platform 11 by rotating the first driving unit 21.

Further, the second moving module 3 can include a second moving unit 30 and a second driving unit 31 movably disposed on the first moving module 2. The second driving unit 31 can be movably disposed on the second moving unit 30 in a penetrating way and disposed on the first moving module 2. When the second driving unit 31 rotates, the second moving unit 30 is driven by the second driving unit 31 to perform the second axial movement relative to the first moving module 2.

For example, the second moving module 3 provided by the present invention further includes a second moving unit 30 and a second driving unit 31. The second moving unit 30 can be a moving platform, and can be movably jointed or engaged with the first moving unit 20. The second driving unit 31 may be a driving handle, and may be fixed to the first moving unit 20 and movably connected to the second moving unit 30. Therefore, the user can drive the second moving unit 30 to perform the second axial movement (such as the Y axis, but not limited thereto) on the first moving unit 20 by rotating the second driving unit 31.

Further, the third moving module 4 may include a third moving unit 40 and a third driving unit 41 movably connected to the movable bearing platform 11 and the module body 10. The third driving unit 41 is movably connected to the third moving unit 40 and disposed in the module body 10. When the third driving unit 41 rotates, the third moving unit 40 is driven by the third driving unit 41 to drive the movable bearing platform 11 to perform the third axial movement (such as the Z axis, but not limited thereto) relative to the module body 10.

For example, the third moving module 4 provided by the present invention further includes a third moving unit 40 and a third driving unit 41. The third moving unit 40 may be a worm structure, and is movably engaged with the movable bearing platform 11 and the third driving unit 41. One end of the third driving unit 41 can be engaged with the third moving unit 40, and the other end of the third driving unit 41 can be connected to a driving source (for example, a motor, but not limited thereto). Therefore, when the third driving unit 41 is driven by the driving source, the third driving unit 41 drives the third moving unit 40 to rotate, and the third moving unit 40 drives the movable bearing platform 11 to move to the third axial movement, thereby driving the reaction module 5 to move in the third axial movement.

Further, the base module 1 includes a limiting unit 12 disposed on the movable bearing platform 11 in a penetrating way and disposed on the module body 10.

For example, the base module 1 provided by the present invention can further provide a limiting unit 12 on the module body 10, and the limiting unit 12 is disposed on the movable bearing platform 11. Therefore, when the third moving unit 40 drives the movable bearing platform 11 to move to the third axial movement, the limiting unit 12 can be functioned as a guide to avoid the situation that the movable bearing platform 11 is tilted.

However, the above-mentioned examples are only one of the possible embodiments and are not intended to limit the present invention.

Third Embodiment

Reference is made to FIG. 3 to FIG. 6, which are respectively a partial perspective view of the multi-axis mechanism device according to the third embodiment of the present invention, a partial perspective view of the multi-axis mechanism device according to the third embodiment of the present invention, a partial front elevational view of the multi-axis mechanism device of the third embodiment of the present invention and a schematic view showing the operation of the reaction module of the multi-axis mechanism device according to the third embodiment of the present invention, and FIG. 1 and FIG. 2 together. As shown in the figures, the same components of the multi-axis mechanism device of the present embodiment are similar to those of the multi-axis mechanism device of the above embodiments, and will not be described again. It is worth noting that in the present embodiment, the reaction module 5 may include a housing unit 50, a support unit 51, a swing unit 52, and an activity unit 53. The housing unit 50 is disposed on the base module 1, the first moving module 2, and the second moving module 3 in a penetrating way. The support unit 51 is located in the housing unit 50. The swing unit 52 is coupled to the housing unit 50, and has an accommodation space 520. The activity unit 53 is movably connected to the support unit 51 and located in the accommodation space 520, and the activity unit 53 contacts the swing unit 52.

Specifically, the reaction module 5 provided by the present invention further includes a housing unit 50, a support unit 51, a swing unit 52, and an activity unit 53. The housing unit 50 can be an elongated structure and is disposed on the movable bearing platform 11, the first moving module 2, and the second moving module 3 in a penetrating way. The support unit 51 is located in the housing unit 50 and preferably connectable to the housing unit 50. The swing unit 52 is movably connected to the housing unit 50. The swing unit 52 has an accommodation space 520 for accommodating the activity unit 53 and the object to be detected (for example, a semiconductor device, but not limited thereto). The activity unit 53 can be movably connected to the support unit 51, for example, by the cooperation of the stud and the bearing device, but not limited thereto; and the activity unit 53 can contact the swing unit 52, for example, the activity unit 53 can be in contact with the inner wall of the swing unit 52 through the bearing device.

Further, the tilting module 6 may include a fourth driving unit 60 and a guiding unit 61 connected to the fourth driving unit 60. The guiding unit 61 is disposed on the housing unit 50 in a penetrating way and movably connected to the swing unit 52. The fourth driving unit 60 drives the swing unit 52 to perform the titling action by driving the guiding unit 61 to perform the third axial movement, and the swing unit 52 drives the activity unit 53 to perform the tilting action.

For example, the tilting module 6 provided by the present invention may further include a fourth driving unit 60 and a guiding unit 61. The fourth driving unit 60 can be a driving motor and is disposed on the reaction module 5, but is not limited thereto. The guiding unit 61 is disposed on the housing unit 50 in a penetrating way and movably connected to the swing unit 52. Therefore, the multi-axis mechanism device Z of the present invention can drive the guiding unit 61 to perform the third axial movement (equivalent to the rising or falling movement, but not limited thereto) by the fourth driving unit 60 to drive the swing unit 52 to perform a tilting action. At this time, since the activity unit 53 is in contact with the swing unit 52 and movably connected to the support unit 51, the swing unit 52 also drives the activity unit 53 to tilt together while the swing unit 52 performs the titling action, and the object to be detected in the accommodation space 520 is also tilted.

Further, the swing unit 52 may include a first member 521, a movable member 522, and a second member 523. The first component 521 is coupled to the housing unit 50. The movable member 522 is coupled to the first member 521. The second member 523 is coupled to the movable member 522, and the second member 523 has a joint portion 5230. The guiding unit 61 has a guiding portion 610, and the guiding portion 610 is movably connected to the joint portion 5230. The guiding unit 61 performs the third axial movement and drives the joint portion 5230 through the guiding portion 610 to drive the second member 523 to perform the titling action, thereby causing the one portion of the movable member 522 to be in a compressed state and the other portion of the moving member 522 to be in an extended state.

For example, the swing unit 52 provided by the present invention may further include a first member 521, a movable member 522, and a second member 523. The first component 521 can be an annular structure and is coupled to the housing unit 50. The movable member 522 can be a hose structure and is connected to the first member 521 and the second member 523. The second member 523 may be a hollow structure, and the outer wall of the second member 523 may have a joint portion 5230 for connection of the guiding portion 610 of the guiding unit 61. Therefore, when the guiding unit 61 performs the third axial movement, the second member 523 is driven to tilt by the driving of the guiding portion 610, so that one portion of the movable member 522 is in a compressed state and the other portion of the movable member 522 is in an extended state. Further, the first member 521 does not cause a tilting action.

The reaction module 5 further includes a heating unit 54 connected to the activity unit 53 and located between the activity unit 53 and the second member 523.

For example, the reaction module 5 provided by the present invention may further provide a heating unit 54 in the accommodation space 520 for heating the object to be detected.

However, the above-mentioned examples are only one of the possible embodiments and are not intended to limit the present invention.

Fourth Embodiment

Figure 7:
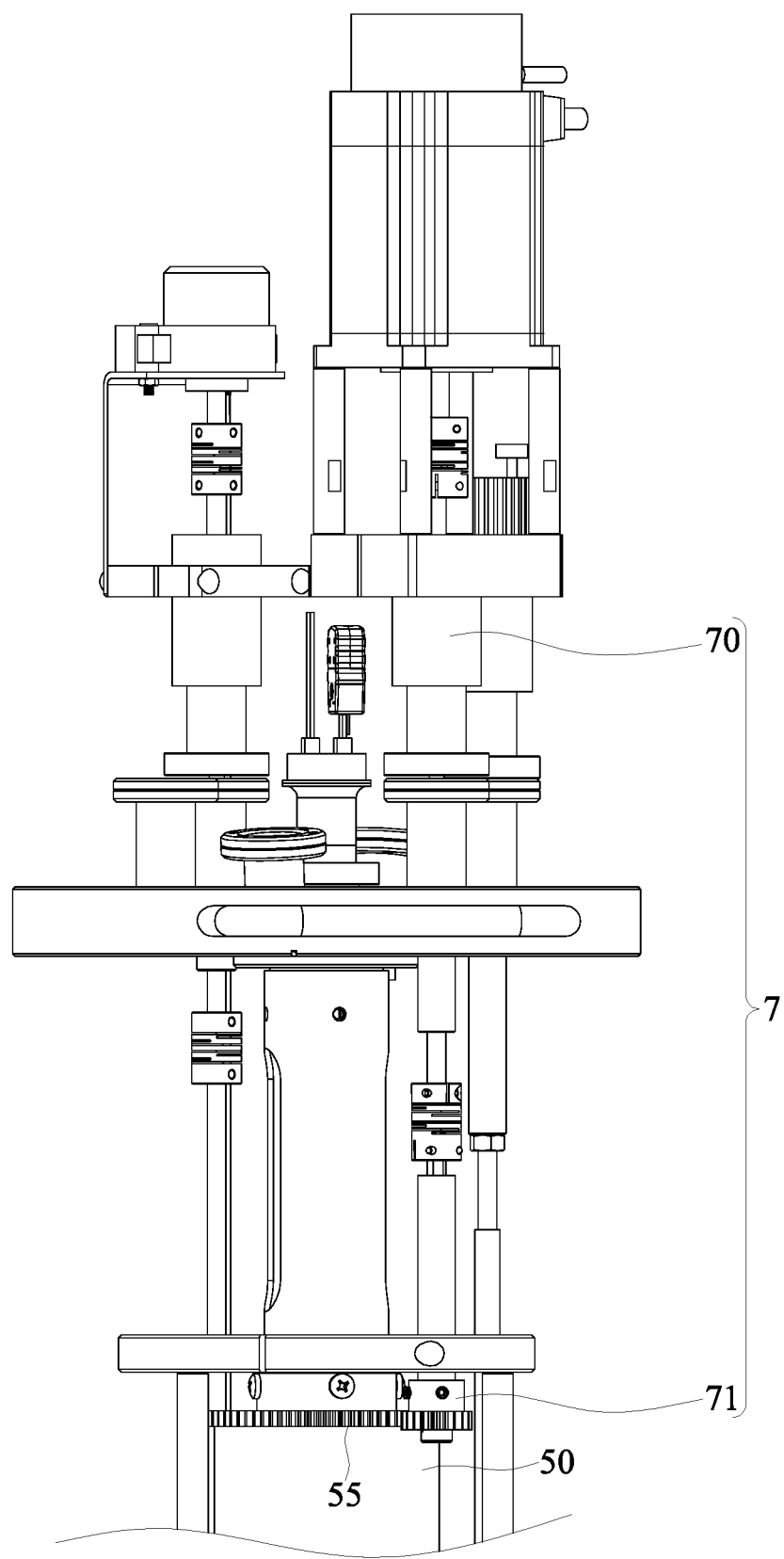
FIG. 7 is a partial structural view of the multi-axis mechanism device according to the fourth embodiment of the present invention.

Reference is made to FIG. 7, which is a partial structural diagram of the multi-axis mechanism device according to the fourth embodiment of the present invention, and FIG. 1 to FIG. 6 together. As shown in the figures, the same components of the multi-axis mechanism device of the present embodiment are similar to those of the multi-axis mechanism device of the above embodiments, and will not be described again. It is worth noting that in the present embodiment, the module 7 includes a fifth driving unit 70 and a linkage unit 71 movably connected to the fifth driving unit 70. The linkage unit 71 is disposed on the reaction module 5 in a penetrating way and movably connected to a connection portion 55 of the reaction module 5. The fifth driving unit 70 drives the linkage unit 71 to rotate and the linkage unit 71 drives the connection portion 55 to operate, thereby making the reaction module 5 to perform a rotation action relative to the central axis.

For example, the rotating module 7 provided by the present invention may further include a fifth driving unit 70 and a linkage unit 71. The fifth driving unit 70 can be a driving motor and is disposed on the reaction module 5, but is not limited thereto. The linkage unit 71 is disposed on the housing unit 50 in a penetrating and movably connected to the connection portion 55 on the outer edge of the reaction module 5. The connection portion 55 can be a sawtooth structure, but not limited thereto.

Therefore, the multi-axis mechanism device Z of the present invention can drive the linkage unit 71 to rotate by the fifth driving unit 70, and the linkage unit 71 rotates the linkage unit 55, thereby driving the reaction module 5 to rotate relative to the central axis 100 (similar to the rotation action).

However, the above-mentioned examples are only one of the possible embodiments and are not intended to limit the present invention.

Advantageous Effects of Embodiments

The present invention has the beneficial effects that the multi-axis mechanism device Z provided by the present invention utilizes the technical solution of "the multi-axis mechanism device Z includes: the base module 1, the first moving module 2, the second moving module 3, the third moving module 4, the reaction module 5, the tilting module 6 and the rotating module 7", "the base module 1 includes the module body 10 and the movable bearing platform 11 movably connected to module body 10", "the first moving module 2 is movably disposed on the movable bearing platform 11", "the second moving module 3 is movably disposed on the first moving module 2", "the third moving module 4 is located on the module body 10 and movably connected to the movable load platform 11", "the reaction module 5 is disposed on the base module 1, the first moving module 2, and the second moving module 3 in a penetrating way, and has a central axis C", "the tilting module 6 is disposed on the reaction module 5 in a penetrating way and movably connected with the reaction module 5", "the rotating module 7 is disposed on the reaction module 5 in a penetrating way and movably connected to the reaction module 5" and "the first moving module 2 performs a first axial movement relative to the movable bearing platform 11 to drive the reaction module 5 to be displaced relative to the movable bearing platform 11, the second moving module 3 performs a second axial movement relative to the first moving module 2 to drive the reaction module 5 to be displaced relative to the first moving module 2, the third moving module 4 drives the movable bearing platform 11 to perform a third axial movement relative to the module body 10 to drive the reaction module 5 to be displaced relative to the module body 10, the reaction module 5 is driven by the tilting module 6 to perform a titling action, and the reaction module 5 is driven by the rotating module 7 to perform a rotating operation relative to the central axis 100" to achieve the technical effects of multi-axial movement and tilting action.

Furthermore, the multi-axis mechanism device Z of the present invention utilizes the movements provided by the modules (i.e., the first moving module 2, the second moving module 3, the third moving module 4, the tilting module 6, and the rotating module 7) to provide the multi-axial movement mode and the tilting effect to the reaction module 5 through the above technical solution, thereby facilitating the operation of detection procedures or other procedures on objects The above disclosure is only a preferred embodiment of the present invention, and is not intended to limit the scope of the claims of the present invention, so any equivalent technical changes made using the description of the present invention and the contents of the drawings are It is intended to be included within the scope of the appended claims.

What is claimed is:

1. A multi-axis mechanism device, comprising:
   a base module, comprising a module body and a movable bearing platform movably coupled to the module body;
   a first moving module, movably disposed on the movable bearing platform;
   a second moving module, movably disposed on the first moving module;
   a third moving module, located in the module body and movably connected to the movable bearing platform;
   a reaction module, disposed on the base module, the first moving module, and the second moving module in a first penetrating way, wherein the reaction module has a central axis;
   a tilting module, disposed on the reaction module in a second penetrating way and movably coupled to the reaction module; and
   a rotating module, disposed on the reaction module in a third penetrating way and movably connected to the reaction module;
   wherein, the first moving module performs a first axial movement relative to the movable bearing platform to drive the reaction module to be displaced relative to the movable bearing platform;
   wherein, the second moving module performs a second axial movement relative to the first moving module to drive the reaction module to be displaced relative to the first moving module;
   wherein, the third moving module drives the movable bearing platform to perform a third axial movement relative to the module body to drive the reaction module to be displaced relative to the module body;
   wherein, the reaction module is driven by the tilting module to perform a titling action; and
   wherein, the reaction module is driven by the rotating module to perform a rotating operation relative to the central axis.

2. The multi-axis mechanism device according to claim 1, wherein the first moving module comprises a first moving unit and a first driving unit movably disposed on the movable bearing platform, and the first driving unit is movably disposed on the first moving unit in a fourth penetrating way and disposed on the movable bearing platform; wherein, when the first driving unit rotates, the first moving unit is driven by the first driving unit to perform the first axial movement relative to the movable bearing platform.

3. The multi-axis mechanism device according to claim 1, wherein the second moving module comprises a second moving unit and a second driving unit movably disposed on the first moving module, and the second driving unit is movably disposed on the second moving unit in a fifth penetrating way and disposed on the first moving module; wherein, when the second driving unit rotates, the second moving unit is driven by the second driving unit to perform the second axial movement relative to the first moving module.

4. The multi-axis mechanism apparatus according to claim 1, wherein the third moving module comprises a third moving unit and a third driving unit movably coupled to the movable bearing platform and the module body, and the third driving unit is movably connected to the third moving unit and disposed on the module body; wherein, when the third driving unit rotates, the third moving unit is driven by the third driving unit to drive the movable bearing platform to perform the third axial movement relative to the module body.

5. The multi-axis mechanism device of claim 1, wherein the reaction module comprises:
 a housing unit, disposed on the base module, the first moving module, and the second moving module in a sixth penetrating way;
 a support unit, located in the housing unit;
 a swing unit, coupled to the housing unit, wherein the swing unit has an accommodation space; and
 an activity unit movably connected to the support unit and located in the accommodation space, wherein the activity unit contacts the swing unit.

6. The multi-axis mechanism device according to claim 5, wherein the tilting module comprises a fourth driving unit and a guiding unit connected to the fourth driving unit, the guiding unit is disposed on the housing unit in a seventh penetrating way and movably connected to the swing unit; wherein the fourth driving unit drives the guiding unit to perform the third axial movement to drive the swing unit to perform the tilting action, and the swing unit drives the activity unit to perform the tilting action.

7. The multi-axis mechanism device according to claim 6, wherein the swing unit comprises:
 a first component, coupled to the housing unit;
 a movable member, coupled to the first component; and
 a second member, coupled to the movable member, wherein the second member has a joint portion;
 wherein, the guiding unit has a guiding portion, and the guiding portion is movably connected to the joint portion; and
 wherein, the guiding unit performs the third axial movement and drives the joint portion through the guiding portion to drive the second member to perform the titling action, thereby causing one portion of the movable member to be in a compressed state and the other portion of the movable member to be in an extended state.

8. The multi-axis mechanism device according to claim 7, wherein the reaction module further comprises: a heating unit connected to the activity unit and located between the activity unit and the second member.

9. The multi-axis mechanism device according to claim 1, wherein the rotating module comprises a fifth driving unit and a linkage unit movably coupled to the fifth driving unit, the linkage unit is disposed on the reaction module in an eighth penetrating way and movably connected to a connection portion of the reaction module; wherein, the fifth driving unit drives the linkage unit to rotate and the linkage unit drives the connection portion to operate, thereby making the reaction module to perform a rotation action relative to the central axis.

10. The multi-axis mechanism device according to claim 1, wherein the base module further comprises: a limiting unit disposed on the movable bearing platform in a ninth penetrating way and disposed on the module body.

\* \* \* \* \*